United States Patent [19]

Günther et al.

[11] Patent Number: 5,233,507
[45] Date of Patent: Aug. 3, 1993

[54] MODULAR UNIT FOR INSERTION INTO HF-TIGHT HOUSINGS FOR ELECTRONIC EQUIPMENT

[75] Inventors: Hans-Ulrich Günther, Pfinztal; Michael Joist, Gaggenau, both of Fed. Rep. of Germany

[73] Assignee: Schroff GmbH, Straubenhardt, Fed. Rep. of Germany

[21] Appl. No.: 861,581

[22] Filed: Apr. 1, 1992

[30] Foreign Application Priority Data

Apr. 4, 1991 [DE] Fed. Rep. of Germany ....... 4110800

[51] Int. Cl.⁵ ..................... H05R 9/00; H01R 13/648
[52] U.S. Cl. .................... 361/818; 174/35 R; 174/35 GC; 361/800; 439/108; 439/607; 439/609
[58] Field of Search .......... 174/35 R, 35 GC, 35 TS, 174/51; 361/415, 424; 439/108, 607, 609

[56] References Cited

U.S. PATENT DOCUMENTS

| | | | |
|---|---|---|---|
| 2,844,644 | 7/1958 | Soule, Jr. | 174/35 R |
| 3,627,900 | 12/1971 | Robinson | 174/51 |
| 3,904,810 | 9/1975 | Kraus | 361/424 |
| 4,631,641 | 12/1986 | Brombal et al. | 361/424 |
| 4,866,213 | 9/1989 | Lindsay | 174/35 GC |
| 4,872,212 | 10/1989 | Roos et al. | 361/424 |
| 4,903,170 | 2/1990 | Finney et al. | 361/424 |
| 5,029,254 | 7/1991 | Stickney | 174/35 R |
| 5,083,239 | 1/1992 | Sedlemeier et al. | 361/424 |

FOREIGN PATENT DOCUMENTS

| | | |
|---|---|---|
| 0222656 | 10/1986 | European Pat. Off. . |
| 2247005 | 4/1974 | Fed. Rep. of Germany . |
| 2002527 | 4/1983 | Fed. Rep. of Germany .... 174/35 R |
| 0133555 | 2/1985 | Fed. Rep. of Germany ........ 174/35 GC |
| 3523770 | 1/1987 | Fed. Rep. of Germany . |
| 3604860 | 8/1987 | Fed. Rep. of Germany ...... 361/424 |
| 8803544 | 8/1988 | Fed. Rep. of Germany . |

Primary Examiner—Lincoln Donovan
Assistant Examiner—D. Sparks
Attorney, Agent, or Firm—Spencer, Frank & Schneider

[57] ABSTRACT

For the purpose of high-frequency sealing the longitudinal gaps between the U-shaped profiles of the front plates of modular units that are to be inserted into HF-tight housings of electronic equipment, a spring element of metal, for example a non-corrosive steel, is proposed. This spring element is composed of two identical contact springs having spring leaves and a spring clip disposed therebetween. The spring clip is provided with a clamping leaf equipped with claws. A planar rear leaf connects the two contact springs with the spring clip. An angled-away insertion strip at the clamping leaf facilitates insertion of the spring clip onto a longitudinally rectangular longitudinal web at the rear face of the front plate. The spring leaves are provided with contact humps and an abutment strip and contact the longitudinal strip of the front plate of the adjacent modular unit which is provided with an insertion slope.

7 Claims, 3 Drawing Sheets

MODULAR UNIT FOR INSERTION INTO HF-TIGHT HOUSINGS FOR ELECTRONIC EQUIPMENT

CROSS REFERENCE TO RELATED APPLICATION

This application claims the priority of application Ser. No P 41 10 800.0, filed Apr. 4, 1991, in the Federal Republic of Germany, the subject matter of which is incorporated herein by reference.

BACKGROUND OF THE INVENTION

The present invention relates to a modular unit for insertion into HF-tight housings of electronic equipment, the modular unit including a circuit board equipped with electronic components, a front plate having a U-shaped cross section and being provided on its one side with a longitudinal web and on its opposite side with a longitudinal strip that is parallel to the longitudinal web and has an insertion slope. Spring elements are provided at the longitudinal web and, when the modular unit is inserted, lie electrically conductively against the longitudinal strip of the front plate of the adjacent modular unit.

The invention is used in connection with modular units for electronic and electrical equipment constructed of modular systems and is employed in conjunction with housings or closed modular unit carriers for which a very high shielding effect is required against electromagnetic influences or which enclose components that cause electromagnetic interferences which must not be permitted to escape.

The use of HF-tight housings and the measures for appropriate shielding are known per se. In the housings, separating grooves are avoided wherever possible or are closed off by electrically contacting seals, wire braids or electrically conductive sealing cords. However, problems are caused by the unavoidable gaps between the parts that are to be inserted and pulled out of the housings, namely the accessory inserts and cassettes of plug-in modular units which are arranged next to one another in the housings and whose juxtaposed front plates form the frontal face of the housings.

To seal the gaps between U-shaped front plates of modular units it is known to provide narrow spring strips at their one longitudinal edge so as to establish electrical contact with the edges of the respectively adjacent front plates once they are inserted (German Utility Model Patent 88/03,544, U.S. Pat. No. 4,631,641); however, after repeated insertion and removal of the modular units, the contacts furnished by the narrow spring strips are no longer very reliable, the short spring leaves soon exhibit fatigue.

German Unexamined Published Patent Application 3,604,860 further proposes to equip the rear face of the front plate to be sealed with a longitudinal strip and with an oppositely disposed longitudinal web which is provided with two adjacent, longitudinal grooves that are set at a right angle to one another. The rear face of a curved sliding spring strip is clamped into these longitudinal grooves and its free end is supported on the base of the longitudinal web so as to slide along the base when compressed. Although the sliding movement provides for self-cleaning of the contact faces, the active spring leg is only rather short due to its contact, which adversely affects the reliability of the established contact.

A two-part, high frequency tight housing is known in which a plurality of juxtaposed spring metal strips having resilient tongues are to ensure good contact between the bottom portion of the housing and the cover. Due to the short structural length of the spring leaves, however, fatigue phenomena will be unavoidable if the cover is opened and closed frequently (German Unexamined Published Patent Application 3,523,770).

Additionally, a shielded housing for electrical devices is known whose door, at the face where it contacts the housing, carries a plurality of contact spring arrangements that are subdivided into segments. In order to hold the juxtaposed contact springs, the door frame has a special configuration which includes a longitudinal slot and a U-shaped angle into which the contact springs are clamped in a form-locking manner. However, this sealing arrangement is not suitable as a HF seal for the front plates of modular units (German Published Patent Application 2,247,005).

SUMMARY OF THE INVENTION

It is an object of the present invention to provide a concept for an improved HF seal arrangement for the front plates of modular units wherein spring elements are employed whose elastic spring leaves, due to their structural length, do not exhibit fatigue and can be produced from a hard spring material which moreover can be manufactured easily by means of extrusion molding, pressing and bending tools, are distinguished by particularly simple installation and ensure reliable contact even under high stresses and with frequent exchange of modular units.

The solution of this problem is based on a prior art modular unit for insertion into the HF-tight housings of electronic equipment as described above.

The problem is solved in that the longitudinal web of the front plate has the cross section of a narrow rectangle; the spring element is composed of two identically configured contact springs, each having a spring leaf as well as a spring clip disposed therebetween and having a clamping sheet; the contact springs and the spring clip have a common planar rear leaf; additionally the spring clip has a U-shaped cross section and can be clampingly pushed onto the longitudinal web of the front plate in such a way that the rear leaf lies against the interior face of the longitudinal web; and the contact springs have a V-shaped cross section, with their spring leaves being spread away from the exterior face of the longitudinal web when the spring clip is attached.

The proposed arrangement makes it possible for the elastically active spring leaves to be made almost as long as the height of the longitudinal strip; therefore, the spring element can be produced also of a less yielding steel, for example stainless steel. The profile of the front plate is simple and therefore easy to manufacture. The U-shaped contact spring permits problem free attachment to the longitudinal face of the front plate without the requirement for a tool.

As an advantageous feature of the invention, the two contact springs are connected with one another by means of a connecting bridge. If the longitudinal strips are not planar, this connecting bridge ensures proper linear contact and the overall spring hardness of the two contact springs can be influenced by a change in its width.

Advisably, the two contact springs are provided with at least one small, embossed contact hump. This contact hump ensures defined contact locations and, in particular, high specific contact pressures.

According to a further feature of the invention, an abutment strip that is bent back in the direction toward the rear leaf is provided at the free end of each spring leaf of the contact springs. This abutment strip prevents overbending and thus damage to the spring leaves during installation and particularly also during insertion and removal of the modular unit. It is of advantage for the clamping leaf of the spring clip to be provided with at least one claw. This claw effectively prevents inadvertent displacement or loosening of the spring element after it has been clampingly pushed onto the longitudinal web.

Advisably, each claw is a punched triangle whose vertex is oriented toward the rear leaf and opposite to the insertion direction of the spring clip. With the given arrangement of the tips the claws acts as barbs which penetrate more or less deeply into the surface of the longitudinal web that is made of a relatively soft material (aluminum).

In order to facilitate the pushing of the spring element onto the longitudinal web, the clamping leaf of the spring clip may change into an insertion strip that is bent upward toward the spring leaf of the contact spring.

It is possible and appropriate to connect the rear leaves of several spring elements with one another and thus form a band that can be rolled up, with the respective number of spring elements required corresponding to the dimensions of the front plate being broken off or cut off during installation.

BRIEF DESCRIPTION OF THE DRAWINGS

The present invention will now be described in greater detail with reference to the three attached drawing sheets. In the drawings, the spring element according to the invention is illustrated in connection with the preferred embodiment of a modular unit that can be inserted into an HF-tight housing. The drawing figures show the following.

DETAILED DESCRIPTION OF THE PREFERRED EMBODIMENT

Figure 1:
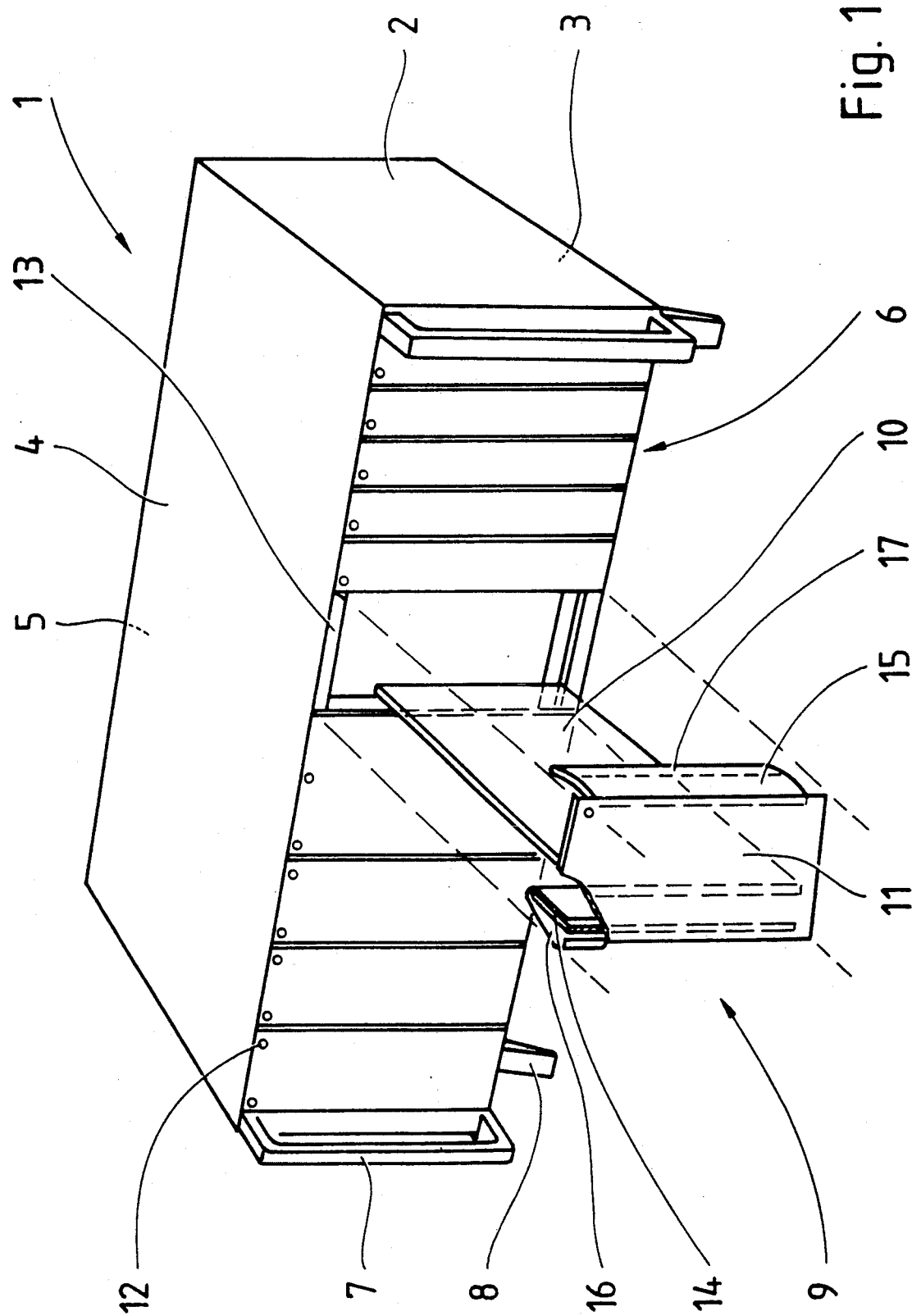
FIG. 1, a simplified illustration reduced in size of an HF-tight housing equipped with a plurality of inserted modular units, one of the modular units being in the pulled-out position.

The prismatic housing 1 for electronic or electrical devices shown in FIG. 1 is made of metal (preferably aluminum) and includes two parallel side walls 2, a bottom 3, a cover 4 as well as a rear wall 5. It is configured in the conventional manner to be tight against high frequencies. In the region of its front 6, two grip handles 7 and two supporting feet 8 are provided on the sides.

A plurality of modular units are inserted into housing 1, one modular unit 9 being in the pulled-out position. This modular unit 9 includes a circuit board 10 which is provided with conductor paths (not shown) and equipped with electronic components (not illustrated). A front plate 11 having an essentially U-shaped cross section is fastened at a right angle to the front of circuit board 10. All front plates are fastened by means of fastening means 12 to a frame 13 at front 6, the frame being equipped with HF sealing means (not shown). When inserted, circuit boards 10 are guided in lower and upper guide rails (not shown) by which they are held in their intended position.

Front plate 11—shown partially broken away—is provided with a longitudinal web 14 at its one side (on the left in FIG. 1) and on its opposite (right) side with a longitudinal strip 15 which is parallel to longitudinal web 14. Longitudinal web 14 and longitudinal strip 15 have the same length and extend almost over the entire height of front plate 11. Front plate 11 is configured as an extrusion molded aluminum profile, with longitudinal web 14 and longitudinal strip 15 being shaped on in one piece.

A one-piece, high-frequency shield S having a plurality of spring elements 16 (shown somewhat enlarged in the drawing) is seated on longitudinal web 14 whose cross section is a narrow rectangle having a rounded front edge. The oppositely disposed longitudinal strip 15 is provided with an insertion slope 17 oriented inwardly toward circuit board 10.

When modular unit 9 is inserted, thus a tightly packed row of these spring elements 16 lies in electrical contact against the longitudinal strip of the front plate of the adjacent modular unit on the left while the spring elements of the adjacent modular unit on the right are in contact with the longitudinal strip 15 of modular unit 9.

Figure 2:
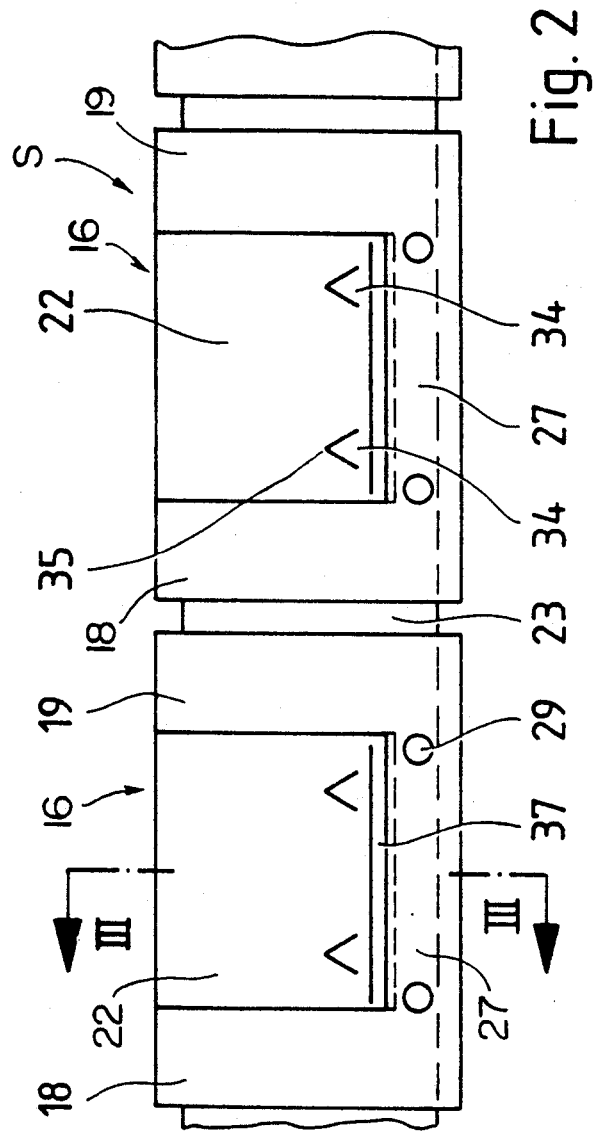
FIG. 2, a plan view several times enlarged of a plurality of interconnected spring elements.
Figure 3:
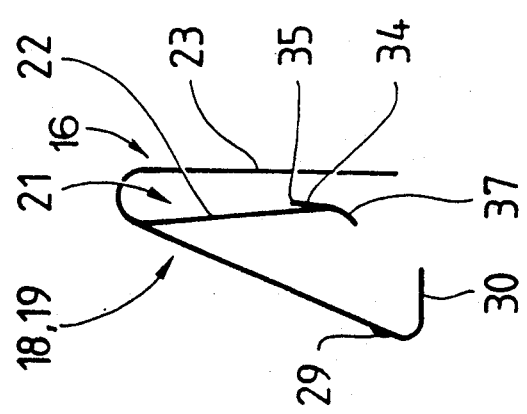
FIG. 3, a cross-sectional view seen along line III—III of FIG. 2 of the spring element according to FIG. 2.
Figure 6:
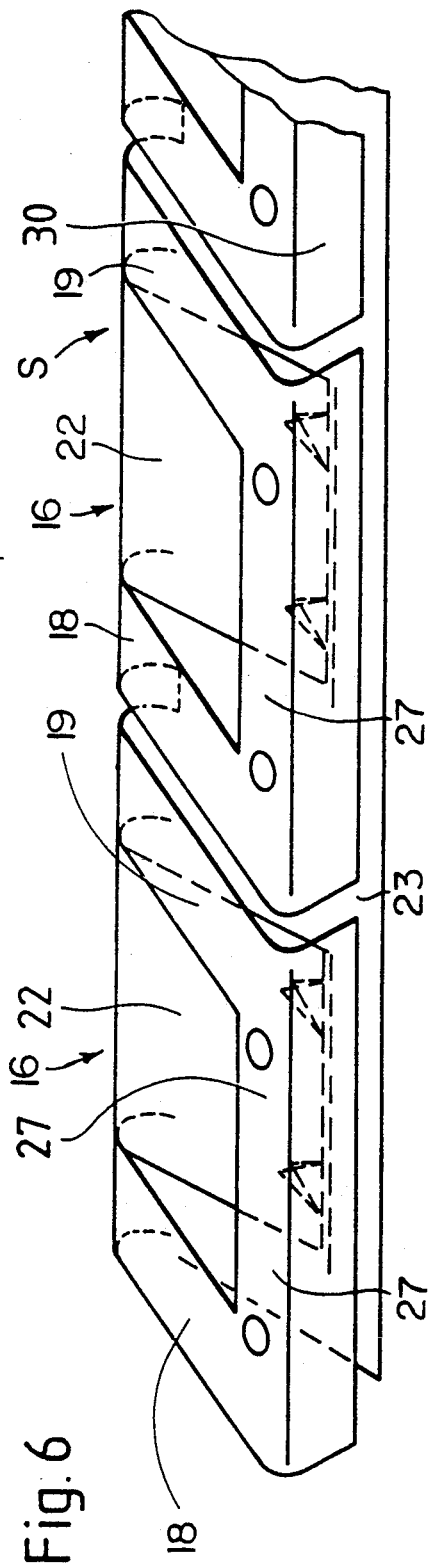
FIG. 6, a perspective illustration of a plurality of interconnected spring elements corresponding to FIG. 2.

With particular reference to FIGS. 2, 3 and 6, each spring element 16 is composed of two identically configured, elastic, spaced, juxtaposed contact spring lenses 18 and 19 and an elastic spring clip leaf (clamping leaf) 22 that is disposed between the two contact spring leaves 18 and 19.

The two contact spring leaves 18 and 19 of each spring element 16 and spring clip leaf 22 are integrally connected to a common planar, thin rear leaf 23 by way of which spring clip leaf 22 is contiguous with the two contact spring leaves 18 and 19, and also, by means of which the spring elements 16 of the high-frequency shield S are contiguous with one another. The spring clip leaf 22 of each spring element 16 forms a spring clip 21 with a respective portion of the rear leaf 23.

Figure 5:
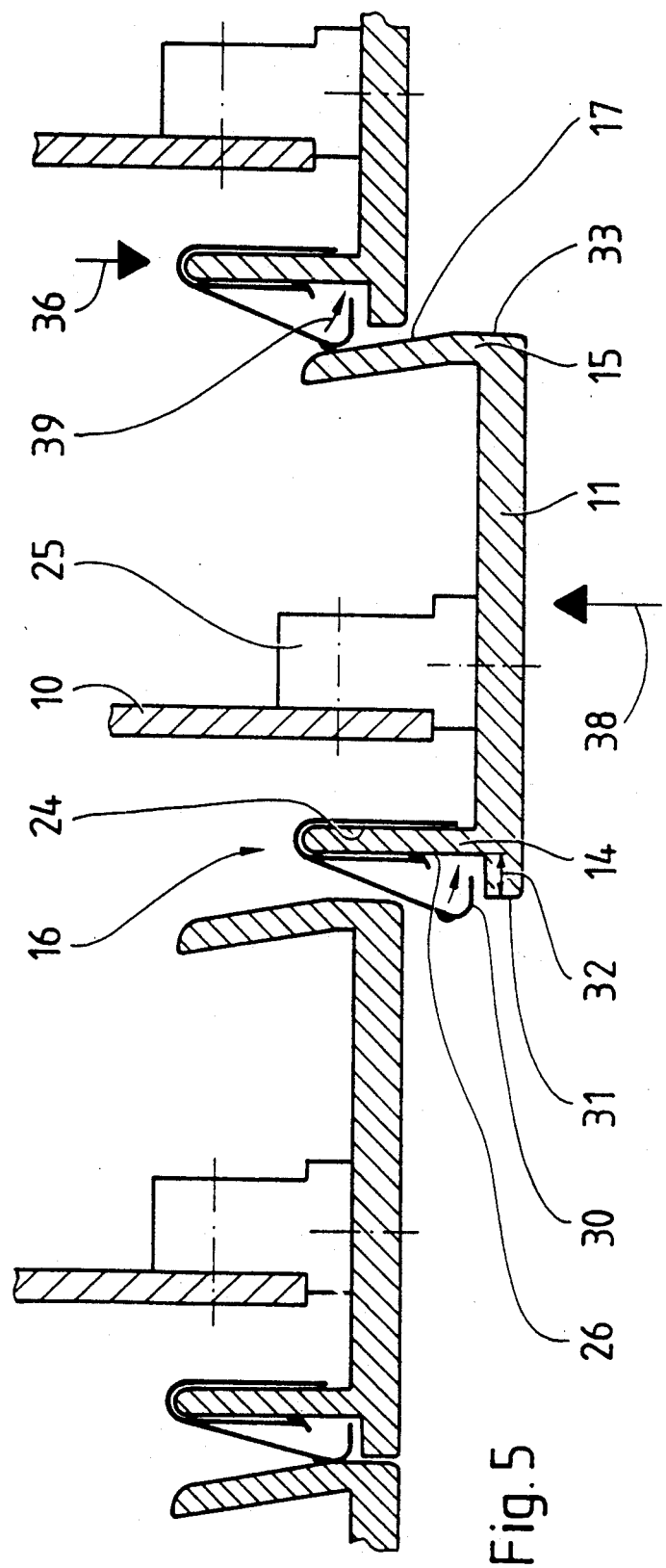
FIG. 5, a cross-sectional view of two adjacent modular units having spring elements pushed onto their longitudinal webs, with the circuit boards and the adjacent modular units being shown broken off and the right modular unit being in the inserted position shortly before reaching its inserted end position.

Spring clip 21 has a U-shaped cross section (compare FIG. 3) and can be pushed in a clamping manner onto the longitudinal web 14 of the front plate so that (compare FIG. 5) the rear leaf 23 lies flat against the interior face 24 of longitudinal web 14 and spring clip 21 encloses the major portion of longitudinal web 14. In FIG. 5 it can also be seen that circuit board 10 is fastened to front plate 11 by means of a metal holding block 25; generally a pivotal removal device (not shown) for the modular unit is articulated to this holding block 25, with the outwardly projecting actuating handle of this removal device passing through front plate 11.

Contact springs 18 and 19 have an essentially V-shaped cross section (see, for example, FIG. 3) and, if spring clip 21 is pushed onto longitudinal web 14 of front plate 11, their spring leaves 20 are spread away from the exterior face 26 of longitudinal web 14 The spreading angle between spring leaves 20 and rear leaf 23 is about thirty angular degrees.

Figure 4:
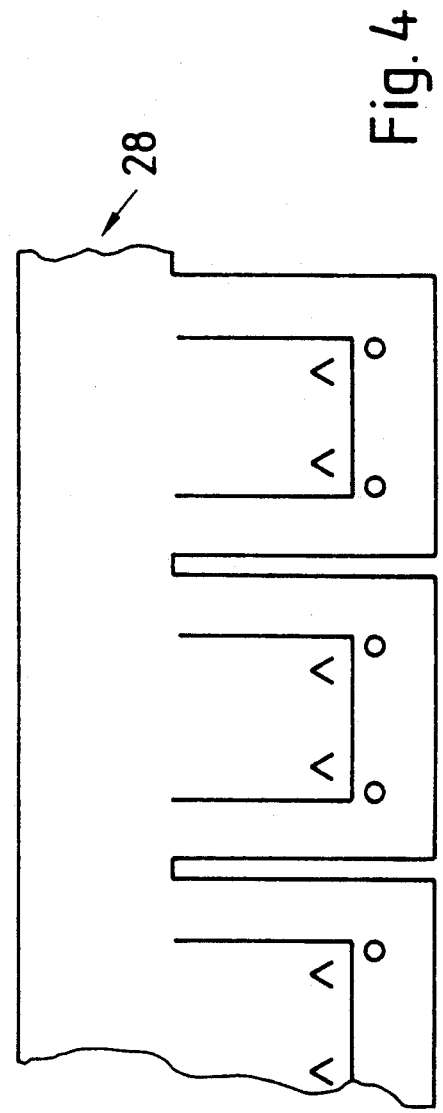
FIG. 4, a plan view of a sheet metal blank for interconnected spring elements according to FIG. 2, to a smaller scale than FIG. 2.

In the embodiment illustrated in the drawings, the two contact springs 18 and 19 of each spring element 16 are connected with one another by way of a connecting bridge 27. Additionally the rear leaves 23 of several spring elements are connected with one another and form a contiguous band 28 as evidenced particularly by the blank shown in an outline in FIG. 4.

The two contact springs 18 and 19 and their connecting bridges 27, respectively, are each provided with a small contact nup 29 and at the free end of the spring leaves 20 of contact springs 18 and 19 there is provided in each case an abutment strip 30 which is bent back in the direction toward rear leaf 23 so as to limit the spring path and to serve as emergency stop. The angle between spring leaves 20 and abutment strip 30 is approximately sixty angular degrees. Longitudinal web 14 (see FIG. 5) is set back relative to the longitudinal edge 31 of front plate 11 by a distance 32 and the height of abutment strip 30 is somewhat less than this distance 32. However, the oppositely disposed longitudinal strip 15 is flush with the oppositely disposed longitudinal edge 3 of front plate 14.

The clamping leaf 22 of spring clip 21 is provided with two claws 34 in the form of triangles that have been pushed through by machine or are partially punched through, with their vertexes 35 being oriented in the direction toward rear leaf 23 and opposite to the insertion direction 36 of spring clip 21 (see FIG. 5).

Additionally, the clamping leaf 22 of spring clip 21 is bent away at the front and steadily changes into an insertion strip 37 (compare FIG. 3) which is pulled upward in the direction toward the spring leaf 20 of contact springs 18 and 19 so as to facilitate the pushing onto longitudinal web 14.

If the housing or component carrier for electronic devices is shielded, an HF seal is provided for the respectively lateral, vertical longitudinal gaps between the front plates 11 of adjacent modular units 9 in that a tightly packed row of spring elements 16 is pushed or plugged from the front onto the longitudinal webs 14 of all front plates II. Upon completion of the attachment, spring clips 21 surround longitudinal webs 14 as clearly shown in FIG. 5. The tips of claws 34 here penetrate into the exterior faces 26 of longitudinal webs 14, and the spring leaves 20 of contact springs 18 and 19 are spread laterally away from the exterior faces 26 of longitudinal webs 14.

If a modular unit 9 is inserted into housing 1 in the direction of arrow 38 (FIG. 5), the insertion slope 17 of the former increasingly depresses the spring leaves of the spring elements of the adjacent modular unit (on the right) in the direction of the small arrow 39 until their contact humps are seated on longitudinal edge 33. At the same time, the longitudinal edge of the opposite modular unit (on the left) pushes the spread-away spring leaves 20 of spring elements 16 in the direction toward longitudinal web 14 until, in the inserted position, their contact humps 29 lie against the longitudinal edge of the longitudinal strip of the left modular units.

It will be understood that the above description of the present invention is susceptible to various modifications, changes and adaptations, and the same are intended to be comprehended within the meaning and range of equivalents of the appended claims.

What is claimed is:

1. A single-piece, high-frequency shield for being clipped on a plate of a modular unit insertable into a housing for electronic equipment; said shield comprising:
   (a) an elongated, planar, single rear leaf having opposite first and second longitudinal edge zones; and
   (b) a series of consecutively disposed spring elements extending along and facing said rear leaf; each spring element having
      (1) two side-by-side positioned, parallel-extending, spaced contact spring leaves each having opposite first and second ends; said first end of said contact spring leaves being integrally connected with said rear leaf at said first longitudinal edge zone thereof;
      (2) a connecting bridge integrally connecting the two contact spring leaves at said second ends thereof;
      (3) a clamping leaf positioned between said two contact spring leaves in a rectangular space defined by the contact spring leaves and said connecting bridge; said clamping leaf being integrally connected at one end thereof to said rear leaf at said first longitudinal edge zone thereof; said clamping leaf and a portion of said rear leaf forming a spring clip of each said spring element for clamping the shield on a plate of a modular unit.

2. A modular unit for insertion into a HF-tight housing for electronic equipment; the modular unit comprising:
   (a) a circuit board carrying electronic components;
   (b) a front plate carrying said circuit board and having a longitudinal web and an opposite, longitudinal strip extending parallel to the web; said web and said strip being oriented generally perpendicularly to said front plate; and
   (c) a single-piece, high-frequency shield including
      (1) an elongated ,planar, single rear leaf having opposite first and second longitudinal edge zones; and
      (2) a series of consecutively disposed spring elements extending along and facing said rear leaf; each spring element having
         (i) two side-by-side positioned, parallel-extending, spaced contact spring leaves each having opposite first and second ends; said first end of said contact spring leaves being integrally connected with said rear leaf at said first longitudinal edge zone thereof;
         (ii) a connecting bridge integrally connecting the two contact spring leaves at said second ends thereof;
         (iii) a clamping leaf positioned between said two contact spring leaves in a rectangular space defined by the contact spring leaves and said connecting bridge; said clamping leaf being integrally connected at one end thereof to said rear leaf at said first longitudinal edge zone thereof; said clamping leaf and a portion of said rear leaf forming a separate spring clip for each said spring element; the separate spring clips being clamped on said longitudinal web for securing said high-frequency shield to said front plate.

3. The modular unit as defined in claim 2, further comprising a contact nub provided on at least some of said contact spring leaves.

4. The modular unit as defined in claim 2, further comprising an abutment strip integrally formed at said second end of said contact spring leaves; the abutment strips being bent towards said rear leaf.

5. The modular unit as defined in claim 2, wherein said clamping leaves have a free terminal portion bent in a direction away from said rear leaf to function as an insertion strip.

6. The modular unit as defined in claim 2, further comprising a claw provided on said clamping leaf and being oriented toward said rear leaf.

7. The modular unit as defined in claim 6, wherein said claw is a pressed-through triangle having a vertex oriented opposite to a direction of insertion of the spring clips onto said longitudinal web.

* * * * *